United States Patent
Tokuda et al.

(10) Patent No.: US 10,540,916 B2
(45) Date of Patent: Jan. 21, 2020

(54) SEMICONDUCTOR LIGHT-EMITTING DEVICE, DISPLAY UNIT, AND ELECTRONIC APPARATUS

(71) Applicant: SONY CORPORATION, Tokyo (JP)

(72) Inventors: Kota Tokuda, Kanagawa (JP); Takayuki Kawasumi, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/062,962

(22) PCT Filed: Dec. 27, 2016

(86) PCT No.: PCT/JP2016/088924
§ 371 (c)(1),
(2) Date: Jun. 15, 2018

(87) PCT Pub. No.: WO2017/119365
PCT Pub. Date: Jul. 13, 2017

(65) Prior Publication Data
US 2019/0005858 A1    Jan. 3, 2019

(30) Foreign Application Priority Data
Jan. 8, 2016    (JP) .................. 2016-002781

(51) Int. Cl.
*G09F 9/33*    (2006.01)
*H01S 5/343*    (2006.01)
(Continued)

(52) U.S. Cl.
CPC .............. *G09F 9/33* (2013.01); *H01S 5/2227* (2013.01); *H01S 5/321* (2013.01); *H01S 5/343* (2013.01); *H01L 33/32* (2013.01)

(58) Field of Classification Search
CPC ......... H01L 33/06; H01L 33/20; H01L 33/32; G09F 9/33; G09F 9/30
See application file for complete search history.

(56) References Cited

U.S. PATENT DOCUMENTS 6,667,498 B2 * 12/2003 Makimoto ........ H01L 29/66318
257/183
7,791,081 B2 *  9/2010 Peter ................... H01L 33/04
257/79
(Continued)

FOREIGN PATENT DOCUMENTS

EP          1280212 A2    1/2003
JP      2000-174327 A    6/2000
(Continued)

OTHER PUBLICATIONS

International Search Report and Written Opinion of PCT Application No. PCT/JP2016/088924, dated Mar. 21, 2017, 13 pages of ISRWO.

*Primary Examiner* — Mark W Tornow
(74) *Attorney, Agent, or Firm* — Chip Law Group

(57) ABSTRACT

A semiconductor light-emitting device according to an embodiment of the present disclosure includes an n-type semiconductor layer, a p-type semiconductor layer, and an active layer provided between the n-type semiconductor layer and the p-type semiconductor layer and including a plurality of well layers. In the plurality of well layers included in the active layer, a band gap inclination angle $\theta 1$ of a second well layer located relatively close to the p-type semiconductor layer is smaller than a band gap inclination angle $\theta 2$ of a first well layer located relatively close to the n-type semiconductor layer.

15 Claims, 10 Drawing Sheets

(51) Int. Cl.
*H01S 5/22* (2006.01)
*H01S 5/32* (2006.01)
*H01L 33/32* (2010.01)

(56) References Cited

U.S. PATENT DOCUMENTS

| | | | |
|---|---|---|---|
| 10,027,090 B2* | 7/2018 | Eichler | H01S 5/3407 |
| 2003/0020085 A1 | 1/2003 | Bour et al. | |
| 2005/0263780 A1 | 12/2005 | Bour et al. | |
| 2008/0273566 A1 | 11/2008 | Nishinaka et al. | |
| 2009/0050875 A1* | 2/2009 | Kim | H01L 33/02 |
| | | | 257/13 |
| 2013/0028281 A1* | 1/2013 | Avramescu | B82Y 20/00 |
| | | | 372/45.01 |

FOREIGN PATENT DOCUMENTS

| | | |
|---|---|---|
| JP | 2003-031902 A | 1/2003 |
| JP | 2003-060232 A | 2/2003 |
| JP | 2005-056973 A | 3/2005 |
| JP | 2008-235606 A | 10/2008 |
| JP | 2011-187591 A | 9/2011 |

\* cited by examiner

[ FIG. 1 ]
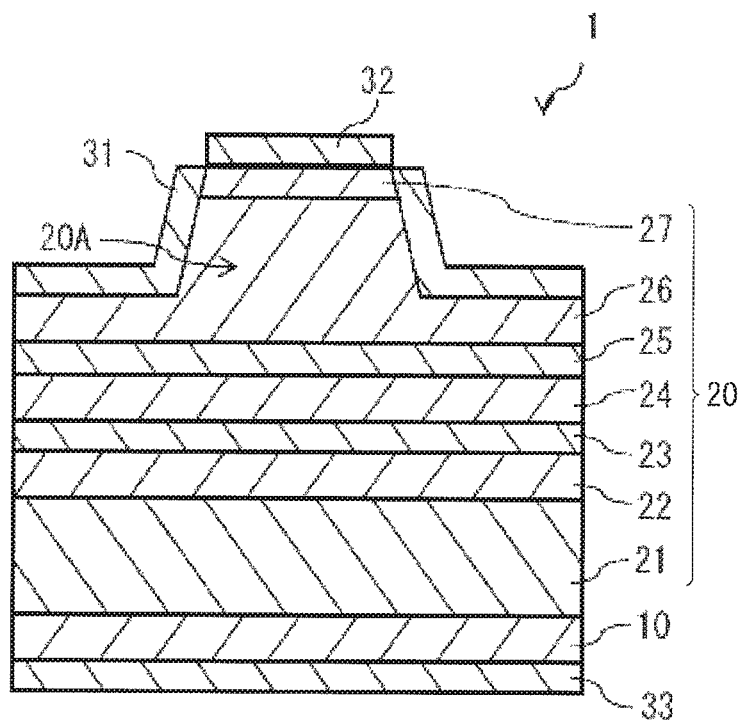
[ FIG. 2 ]
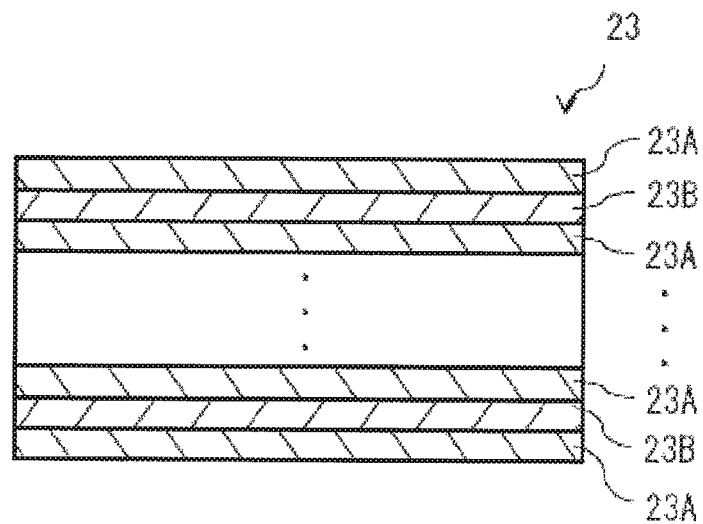

[ FIG. 3 ]
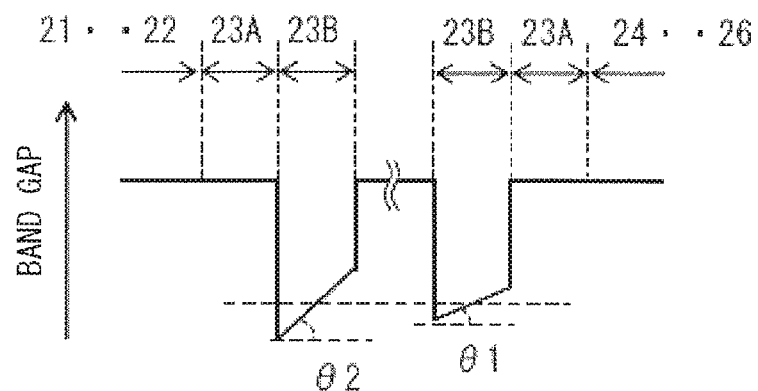
[ FIG. 4 ]
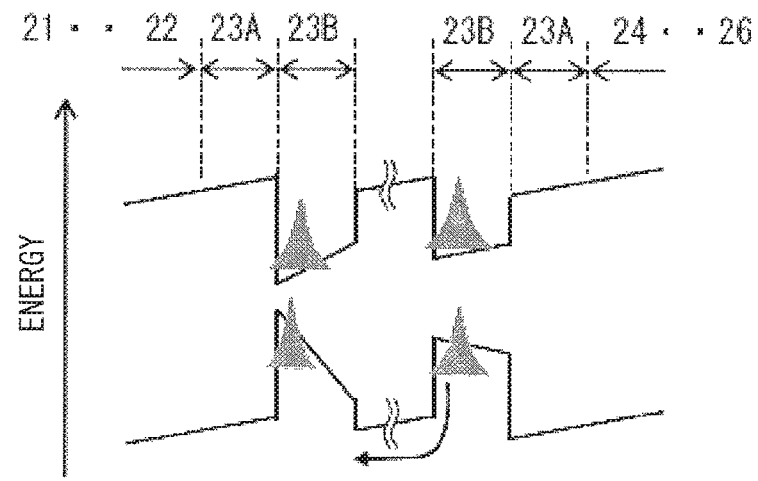

[ FIG. 5 ]
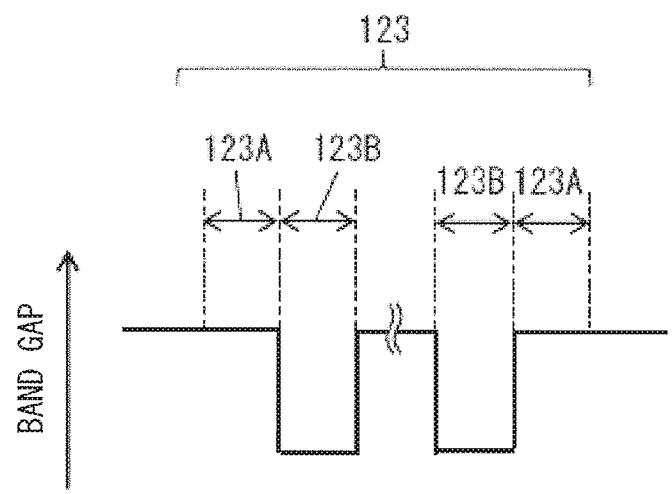
[ FIG. 6 ]
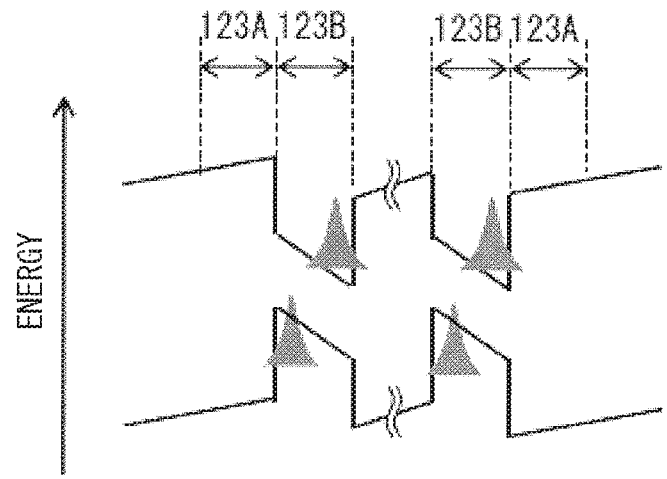

[ FIG. 7 ]
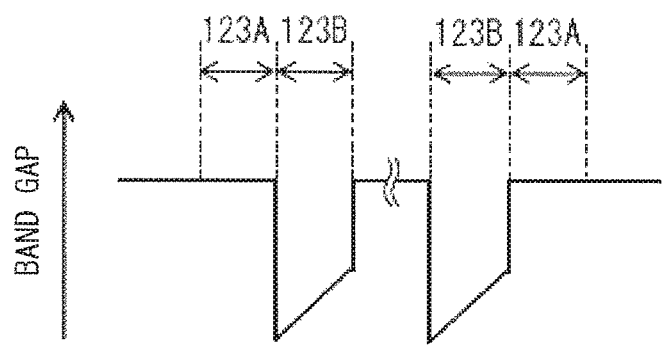
[ FIG. 8 ]
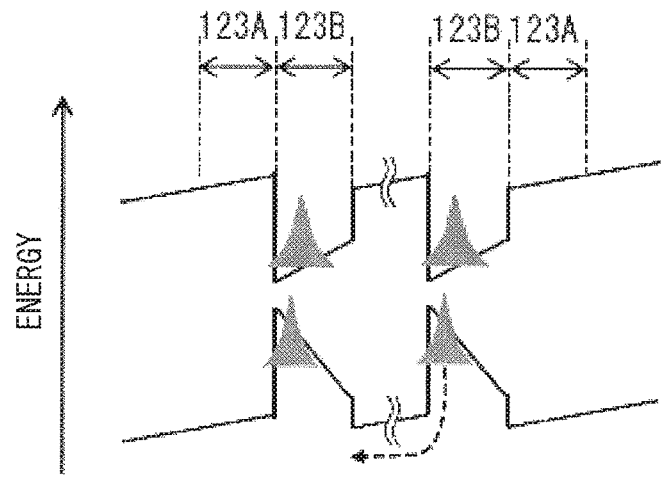

[ FIG. 9 ]
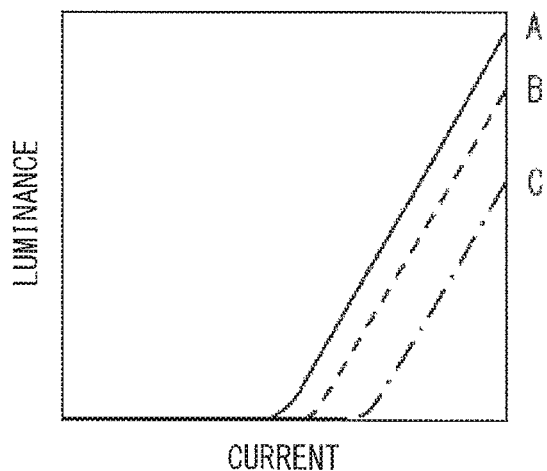
[ FIG. 10 ]
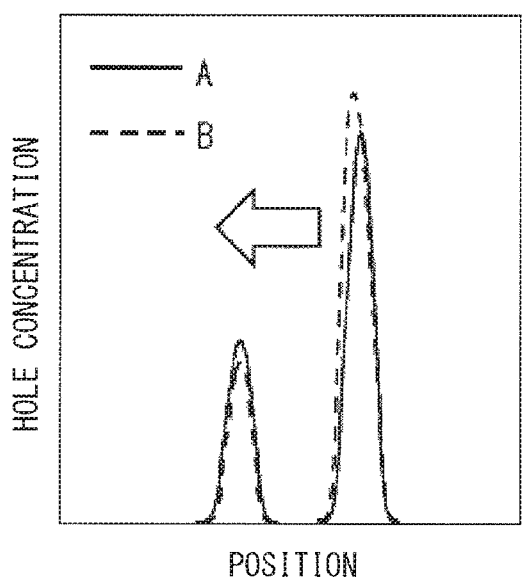

[ FIG. 11 ]
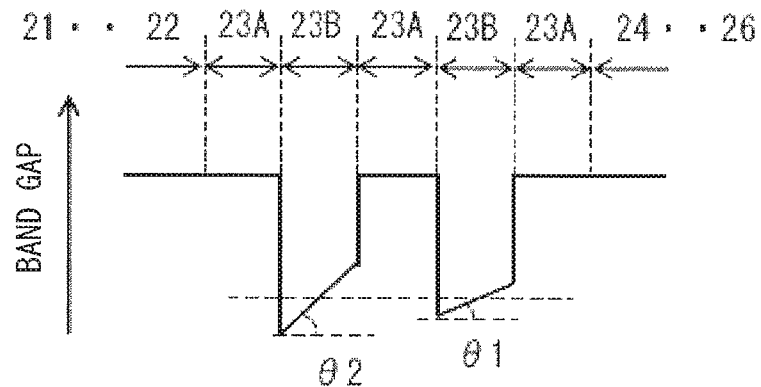
[ FIG. 12 ]
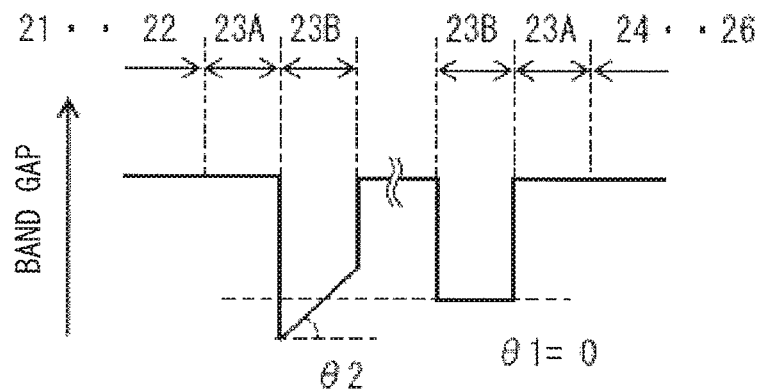
[ FIG. 13 ]
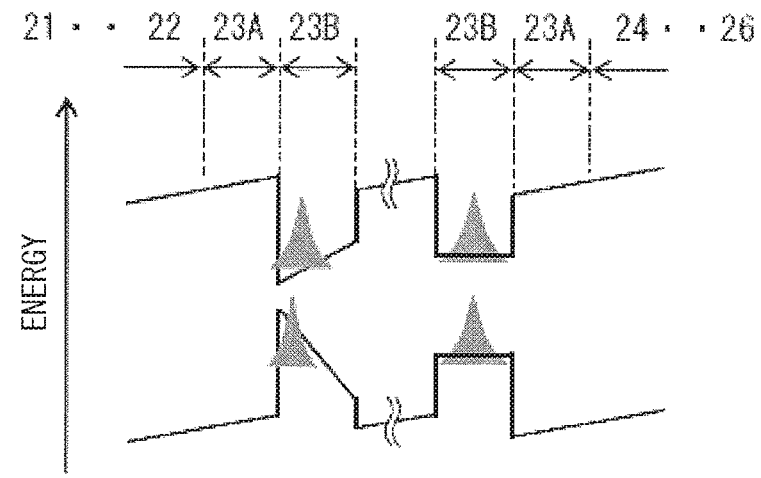

[ FIG. 14 ]
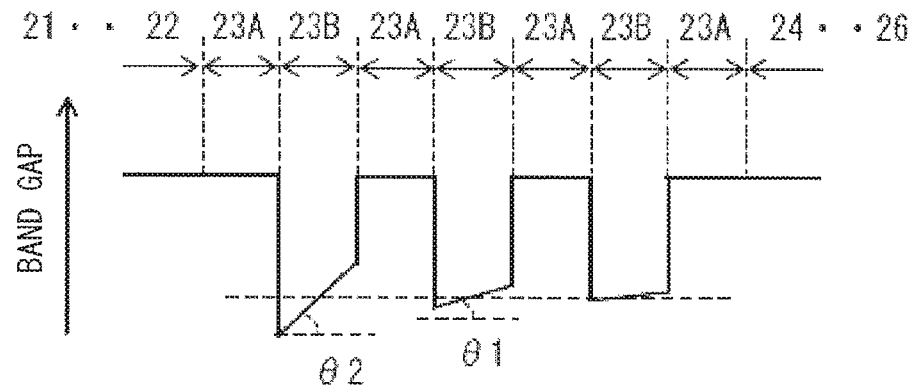
[ FIG. 15 ]
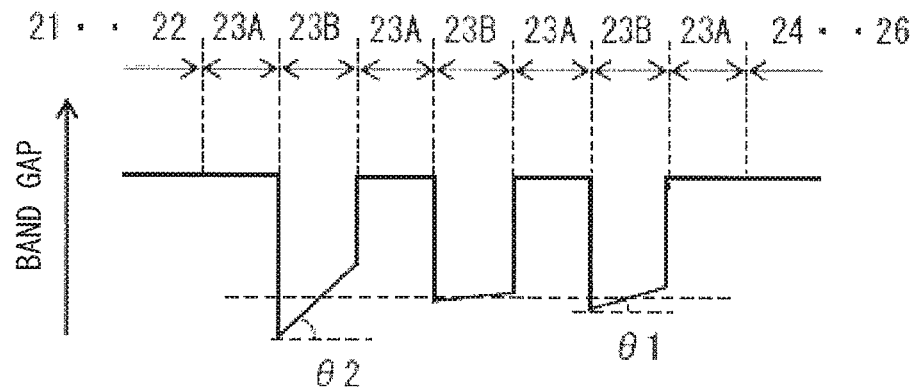
[ FIG. 16 ]
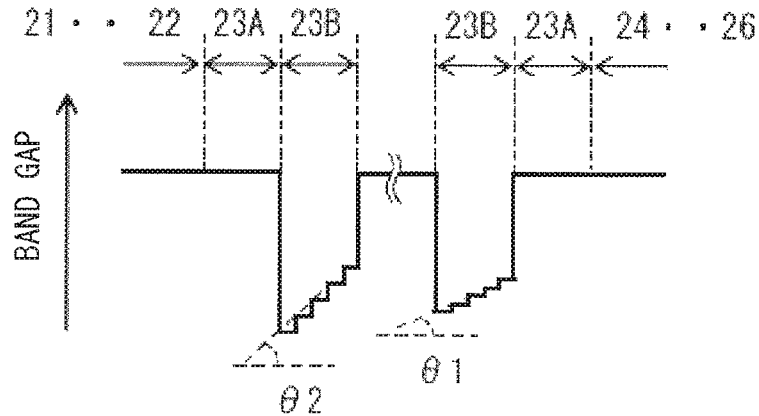

[ FIG. 17 ]
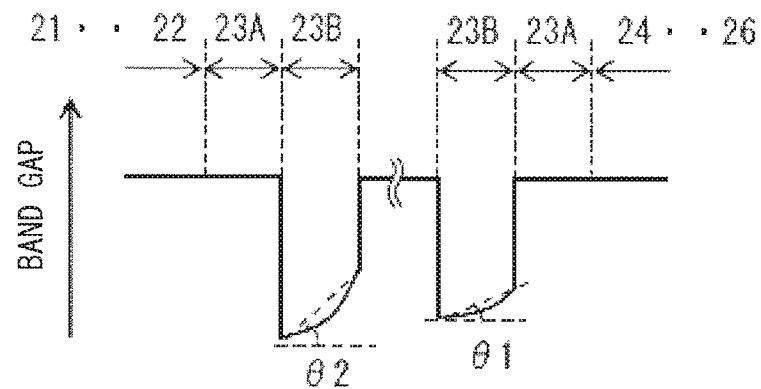
[ FIG. 18 ]
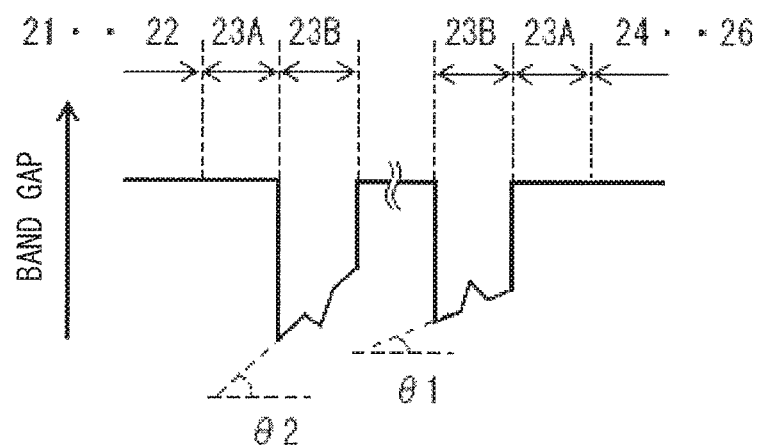
[ FIG. 19 ]
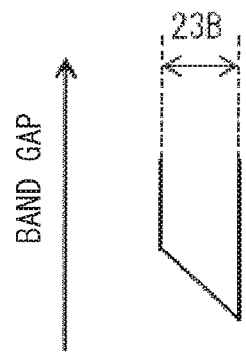

[ FIG. 20 ]
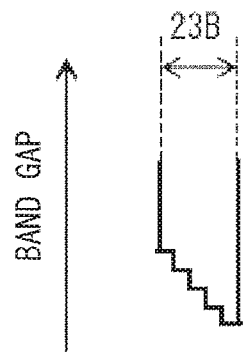
[ FIG. 21 ]
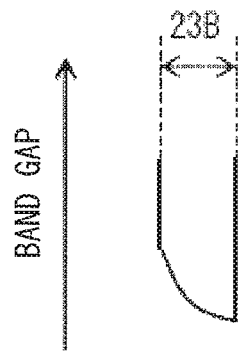
[ FIG. 22 ]
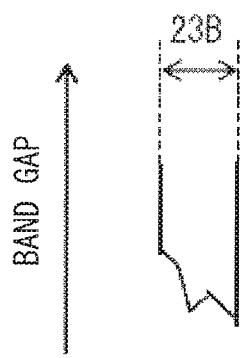

[ FIG. 23 ]
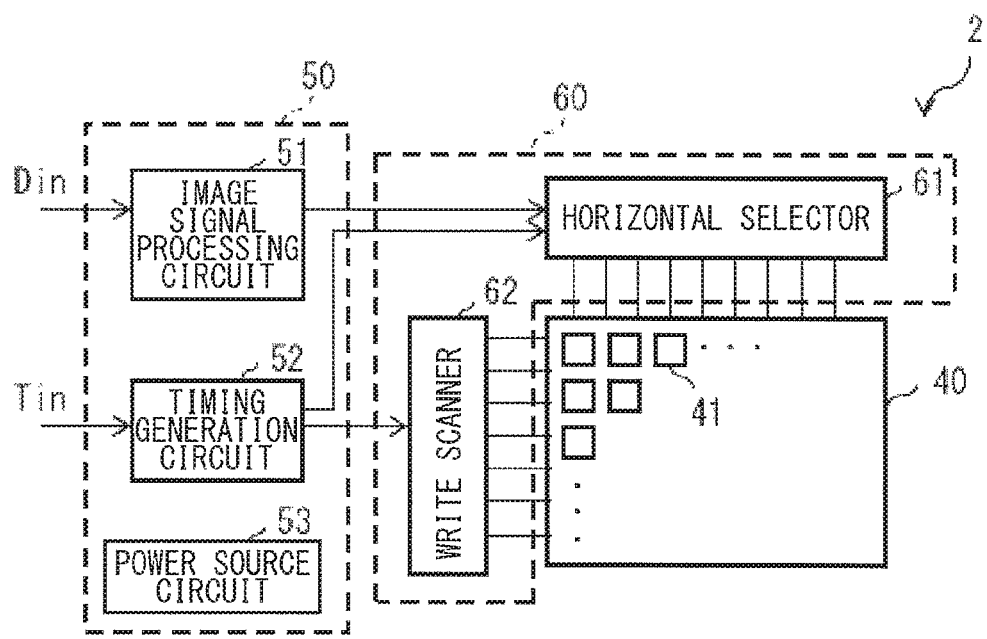
[ FIG. 24 ]
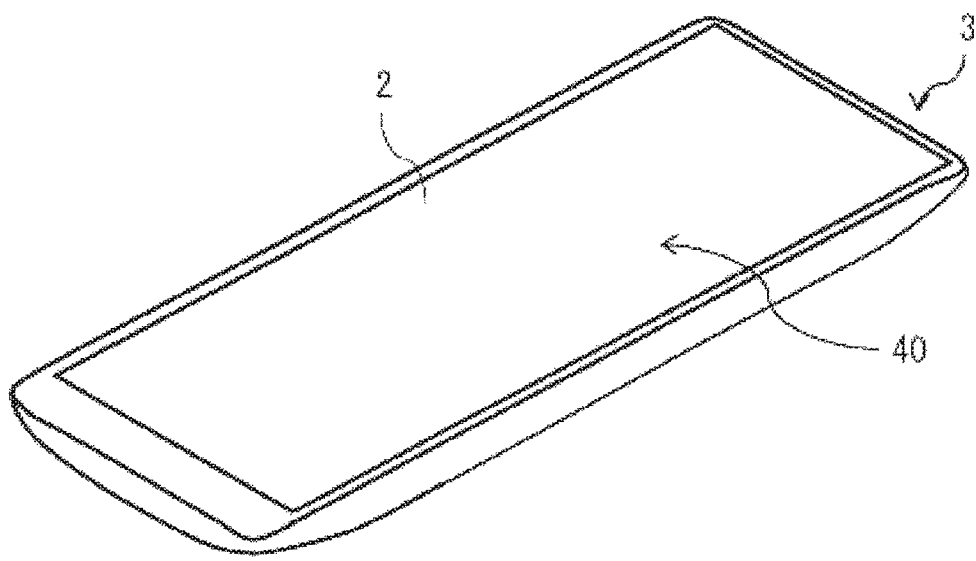

SEMICONDUCTOR LIGHT-EMITTING DEVICE, DISPLAY UNIT, AND ELECTRONIC APPARATUS

CROSS REFERENCE TO RELATED APPLICATIONS

This application is a U.S. National Phase of International Patent Application No. PCT/JP2016/088924 filed on Dec. 27, 2016, which claims priority benefit of Japanese Patent Application No. JP 2016-002781 filed in the Japan Patent Office on Jan. 8, 2016. Each of the above-referenced applications is hereby incorporated herein by reference in its entirety.

TECHNICAL FIELD

The present disclosure relates to a semiconductor light-emitting device, a display unit, and an electronic apparatus.

BACKGROUND ART

In recent years, semiconductor lasers have been used in many fields. For example, semiconductor lasers of red, green, and blue that are three primary colors of light have been all achieved; therefore, it is expected that the semiconductor lasers take advantages of characteristics such as a small size and low power consumption to be applied to image display units such as televisions and projectors. At the same time, for the purpose of application expansion, a further improvement in characteristics of the semiconductor lasers is demanded.

At present, the semiconductor lasers of green and blue of the three primary colors mainly use a hexagonal nitride semiconductor. In the nitride semiconductor, a band in a well layer has an inclination by spontaneous polarization or piezoelectric polarization. This causes an issue that electrons and holes are spatially separated to decrease light emission intensity. Such separation of electrons and holes by spontaneous polarization or piezoelectric polarization is observed not only in the nitride semiconductor but also in, for example, semiconductors having a sphalerite structure such as InGaAs/GaAs-based semiconductors.

In order to solve this issue, for example, PTL 1 discloses a structure in which a band gap is continuously inclined in a well layer. PTL 1 describes that the band gap is inclined toward a direction where a band inclination by piezoelectric polarization of a conduction band or a valence band is reduced, thereby reducing spatial separation of electrons and holes to improve light emission intensity. Moreover, in PTL 1, such an effect is achieved more remarkably in a case where the inclination of the band gap is increased.

CITATION LIST

Patent Literature

PTL 1: Japanese Unexamined Patent Application Publication No. 2005-56973

SUMMARY OF THE INVENTION

However, in a case where the structure disclosed in PTL 1 is applied to a semiconductor light-emitting device including a plurality of well layers, spatial separation of electrons and holes is reduced, but transport of electrons or holes between the well layers becomes difficult, which causes an issue that an effect of an improvement in light emission intensity is not sufficiently achieved.

It is therefore desirable to provide a semiconductor light-emitting device that allows for an improvement in transport of electrons or holes between well layers with reduction in spatial separation of electrons and holes in an active layer including a plurality of well layers, and a display unit including the same.

A semiconductor light-emitting device according to an embodiment of the present disclosure includes: an n-type semiconductor layer; a p-type semiconductor layer; and an active layer provided between the n-type semiconductor layer and the p-type semiconductor layer and including a plurality of well layers. In the plurality of well layers, a first well layer located relatively close to the n-type semiconductor layer and a second well layer located relatively close to the p-type semiconductor layer satisfy the following expression, $$0 \leq \theta1 < \theta2$$

where $\theta1$ is a band gap inclination angle in a thickness direction in the second well layer, and
$\theta2$ is a band gap inclination angle in the thickness direction in the first well layer.

A display unit according to an embodiment of the present disclosure includes a pixel array section including a plurality of display pixels arranged in a matrix; and a drive circuit that drives the respective display pixels. Each of the display pixels includes a plurality of sub-pixels each including a semiconductor light-emitting device. The semiconductor light-emitting device included in at least one of the plurality of sub-pixels in each of the display pixels includes same components as those of the foregoing semiconductor light-emitting device.

An electronic apparatus according to an embodiment of the present disclosure includes the foregoing display unit.

In the semiconductor light-emitting device, the display unit, and the electronic apparatus according to the embodiments of the present disclosure, in the plurality of well layers included in the active layer, the band gap inclination angle of the second well layer located relatively close to the p-type semiconductor layer is smaller than the band gap inclination angle of the first well layer located relatively close to the n-type semiconductor layer. Accordingly, in the semiconductor light-emitting device of the present disclosure, energy barrier of the well layer located close to the p-type semiconductor layer is shallower than energy barrier of the well layer located close to the p-type semiconductor layer in a case where a mutually equal band gap inclination angle is provided to all the well layers.

According to the semiconductor light-emitting device, the display unit, and the electronic apparatus of the embodiments of the present disclosure, in the plurality of well layers included in the active layer, the band gap inclination angle of the second well layer located relatively close to the p-type semiconductor layer is smaller than the band gap inclination angle of the first well layer located relatively close to the n-type semiconductor layer. Hence, in the active layer including the plurality of well layers, it is possible to improve transport of electrons or holes between the well layers while reducing spatial separation of electrons and holes. It is to be noted that effects of the present disclosure are not necessarily limited to effects described herein, and may include any of effects described in the description.

BRIEF DESCRIPTION OF THE DRAWINGS

FIG. 1 is a diagram illustrating a cross-sectional configuration example of a semiconductor light-emitting device according to a first embodiment of the present disclosure.

FIG. 2 is a diagram illustrating a cross-sectional configuration example of an active layer in FIG. 1.

FIG. 3 is a diagram illustrating an example of a band gap of the active layer in FIG. 2.

FIG. 4 is a diagram illustrating an example of a valence band and a conduction band of the active layer in FIG. 3.

FIG. 5 is a diagram illustrating an example of a band gap of an active layer according to a comparative example.

FIG. 6 is a diagram illustrating an example of a valence band and a conduction band of the active layer in FIG. 5.

FIG. 7 is a diagram illustrating another example of the band gap of the active layer according to the comparative example.

FIG. 8 is a diagram illustrating an example of a valence band and a conduction band of the active layer in FIG. 7.

FIG. 9 is a diagram illustrating simulation results of current-light output characteristics in semiconductor light-emitting devices of levels A, B, and C.

FIG. 10 is a diagram illustrating simulation results of a hole concentration distribution in the semiconductor light-emitting devices of the levels A and B.

FIG. 11 is a diagram illustrating a modification example of the band gap of the active layer in FIG. 2.

FIG. 12 is a diagram illustrating a modification example of the band gap of the active layer in FIG. 2.

FIG. 13 is a diagram illustrating an example of a valence band or a conduction band of the active layer in FIG. 12.

FIG. 14 is a diagram illustrating a modification example of the band gap of the active layer in FIG. 2.

FIG. 15 is a diagram illustrating a modification example of the band gap of the active layer in FIG. 2.

FIG. 16 is a diagram illustrating a modification example of the band gap of the active layer in FIG. 2.

FIG. 17 is a diagram illustrating a modification example of the band gap of the active layer in FIG. 2.

FIG. 18 is a diagram illustrating a modification example of the band gap of the active layer in FIG. 2.

FIG. 19 is a diagram illustrating a modification example of a band gap of a well layer in FIG. 2.

FIG. 20 is a diagram illustrating a modification example of the band gap of the well layer in FIG. 2.

FIG. 21 is a diagram illustrating a modification example of the band gap of the well layer in FIG. 2.

FIG. 22 is a diagram illustrating a modification example of the band gap of the well layer in FIG. 2.

FIG. 23 is a diagram illustrating a schematic configuration example of a display unit according to a second embodiment of the present disclosure.

FIG. 24 is a diagram illustrating a schematic configuration example of an electronic apparatus according to a third embodiment of the present disclosure.

MODES FOR CARRYING OUT THE INVENTION

In the following, some embodiments of the present disclosure are described in detail with reference to the drawings. The following description is given of specific examples of the present disclosure, and the present disclosure is not limited to the following embodiments. Moreover, the present disclosure is not limited to positions, dimensions, dimension ratios, etc. of respective components illustrated in the respective drawings. It is to be noted that description is given in the following order.

1. First Embodiment (Semiconductor Light-emitting Device)
2. Modification Examples of First Embodiment (Semiconductor Light-emitting Device)
3. Second Embodiment (Display Unit)
4. Third Embodiment (Electronic Apparatus)

1. First Embodiment

[Configuration]

FIG. 1 illustrates a cross-sectional configuration example of a semiconductor light-emitting device 1 according to a first embodiment of the present disclosure. The semiconductor light-emitting device 1 is a semiconductor laser or a light-emitting diode. It is to be noted that the semiconductor light-emitting device 1 regarded as a semiconductor laser is described below. The semiconductor light-emitting device 1 has a configuration in which a semiconductor layer 20 to be described later is sandwiched between a pair of resonator end surfaces from a resonator direction (a direction where a ridge section 20A extends). Accordingly, the semiconductor light-emitting device 1 is one kind of so-called edge-emitting type semiconductor laser. The semiconductor light-emitting device 1 includes the semiconductor layer 20 on a substrate 10. The semiconductor layer 20 includes, for example, a cladding layer 21, a light guide layer 22, an active layer 23, a light guide layer 24, a carrier block layer 25, a cladding layer 26, and a contact layer 27 in this order from a side on which the substrate 10 is located. It is to be noted that the semiconductor layer 20 may further include any layer (for example, a buffer layer, etc.) other than the layers mentioned above. Moreover, in the semiconductor layer 20, the light guide layers 22 and 24, and the carrier block layer 25 may be omitted. The cladding layer 21 corresponds to a specific example of an "n-type semiconductor layer" of the present disclosure. The cladding layer 26 corresponds to a specific example of a "p-type semiconductor layer" of the present disclosure.

The substrate 10 and the semiconductor layer 20 include, for example, a Group III-V nitride semiconductor such as GaN. Herein, the "Group III-V nitride semiconductor" refers to a semiconductor including at least one kind selected from a group of Group 3B elements in the short form of the periodic table of the elements (at least one element of Ga, Al, In, and B) and at least an N element of Group 5B elements in the short form of the periodic table of the elements. An example of the Group III-V nitride semiconductor is a gallium nitride-based compound including Ga and N. Examples of the gallium nitride-based compound include GaN, AlGaN, AlGaInN, etc. The Group III-V nitride semiconductor is doped with an n-type impurity of a Group IV or VI element such as Si, Ge, O, and Se or a p-type impurity of a Group II or IV element such as Mg, Zn, and C on an as-needed basis. The substrate 10 may include AlN, $Al_2O_3$ (sapphire), SiC, Si, or ZrO.

The substrate 10 may be a Group III-V nitride semiconductor substrate such as a GaN substrate. In this case, a crystal face of a main surface of the GaN substrate may be one of a polar face, a semi-polar face, and a non-polar face. The polar face is represented by, for example, $\{0, 0, 0, 1\}$ or $\{0, 0, 0, -1\}$ with use of face indices. The semi-polar face is represented by, for example, $\{2, 0, -2, 1\}$, $\{1, 0, -1, 1\}$, $\{2, 0, -2, -1\}$, or $\{1, 0, -1, -1\}$ with use of face indices. The non-polar face is represented by, for example, $\{1, 1, -2, 0\}$ or $\{1, -1, 0, 0\}$ with use of face indices. In a case where a GaN substrate having a crystal face orientation $\{2, 0, -2, 1\}$ as a main surface is used as a crystal formation substrate of the semiconductor layer 20, the semiconductor layer 20 having high crystal quality is formed.

The cladding layer 21 is formed on a main surface of the substrate 10, and includes, for example, a semiconductor layer having n-type conductivity (an n-type semiconductor layer). The cladding layer 21 includes, for example, one of a GaN layer, an AlGaN layer, and an AlGaInN layer, or at least two layers of these layers. In the cladding layer 21, for example, Si is used as a dopant to obtain n-type conductivity. A film thickness of the cladding layer 21 is, for example, from 500 nm to 3000 nm.

The light guide layer 22 is formed, for example, on the cladding layer 21, and includes, for example, a semiconductor layer having n-type conductivity (an n-type semiconductor layer). The light guide layer 22 includes, for example, one of a GaN layer, an AlGaN layer, an InGaN layer, and an AlGaInN layer, or at least two layers of these layers. In the light guide layer 22, for example, Si is used as a dopant to obtain n-type conductivity. A film thickness of the light guide layer 22 is, for example, from 10 nm to 500 nm. It is to be noted that the light guide layer 22 may include a non-doped semiconductor layer.

The light guide layer 24 is formed, for example, on the active layer 23, and includes, for example, a semiconductor layer having n-type conductivity (an n-type semiconductor layer). The light guide layer 24 includes, for example, one of a GaN layer, an AlGaN layer, an InGaN layer, and an AlGaInN layer, or at least two layers of these layers. In the light guide layer 24, for example, Si is used as a dopant to obtain n-type conductivity. A film thickness of the light guide layer 24 is, for example, from 10 nm to 500 nm. It is to be noted that the light guide layer 24 may include a non-doped semiconductor layer.

The carrier block layer 25 is formed on the light guide layer 24, and includes, for example, a semiconductor layer having p-type conductivity (a p-type semiconductor layer). The carrier block layer 25 includes, for example, one of a GaN layer, an AlGaN layer, and an AlGaInN layer, or at least two layers of these layers. In the carrier block layer 25, for example, Mg is used as a dopant to obtain p-type conductivity. A film thickness of the carrier block layer 25 is, for example, from 3 nm to 100 nm. It is to be noted that the carrier block layer 25 may be provided inside the light guide layer 24 or the cladding layer 26.

The cladding layer 26 is formed, for example, on the carrier block layer 25, and includes, for example, a semiconductor layer having p-type conductivity (a p-type semiconductor layer). The cladding layer 26 includes, for example, one of a GaN layer, an AlGaN layer, and an AlGaInN layer, or at least two layers of these layers. In the cladding layer 26, for example, Mg is used as a dopant to obtain p-type conductivity. A film thickness of the cladding layer 26 is, for example, from 100 nm to 1000 nm.

The contact layer 27 is formed, for example, on the cladding layer 26, and includes, for example, a semiconductor layer having p-type conductivity (a p-type semiconductor layer). The contact layer 27 includes, for example, one of a GaN layer, an AlGaN layer, and an AlGaInN layer, or at least two layers of these layers. In the contact layer 27, for example, Mg is used as a dopant to obtain p-type conductivity. A film thickness of the contact layer 27 is, for example, from 1 nm to 100 nm.

The protruded ridge section 20A is formed in an upper portion of the semiconductor layer 20, specifically, in a portion of the cladding layer 26 and the contact layer 27. The contact layer 27 is formed on a top surface of the ridge section 20A. The ridge section 20A extends in a direction parallel to an in-plane direction of a stacking surface of the semiconductor layer 20, and is sandwiched between a pair of resonator end surfaces in the semiconductor layer 20. A length of the ridge section 20A is, for example, from 50 um to 3000 um. A width of the ridge section 20A is, for example, 0.5 um to 100 um. The ridge section 20A is formed, for example, by removing a portion from a surface of the contact layer 27 to a middle of the cladding layer 26 by etching. It is to be noted that the ridge section 20A may be in contact with the carrier block layer 25.

A side surface and a base portion of the ridge section 20A of a top surface of the semiconductor layer 20 are covered with an insulating film 31. The insulating film 31 includes, for example, a SiO2 film. A film thickness of the insulating film 31 is, for example, from 10 nm to 500 nm. An electrode layer 32 is formed on the contact layer 27. The electrode layer 32 has, for example, a configuration in which a Pd layer and a Pt layer are stacked in this order from a side close to the contact layer 27. A film thickness of the Pd layer is, for example, from 5 nm to 50 nm. A film thickness of the Pt layer is, for example, from 10 nm to 300 nm. An electrode layer 33 is formed in contact with a back surface of the substrate 10. The electrode layer 33 has, for example, a configuration in which a Ti layer and an Al layer are stacked in this order from a side close to the substrate 10. A film thickness of the Ti layer is, for example, 5 nm to 50 nm. A film thickness of the Al layer is, for example, from 10 nm to 300 nm.

Next, description is given of the active layer 23. FIG. 2 illustrates a cross-sectional configuration example of the active layer 23. The active layer 23 is formed, for example, on the light guide layer 22. The active layer 23 is provided between the cladding layer 21 and the cladding layer 26. The active layer 23 is configured, for example, by alternately stacking barrier layers 23A and well layers 23B, as illustrated in FIG. 2, and has a multiple well structure. In other words, the active layer 23 includes a plurality of well layers 23B. It is to be noted that the active layer 23 may have a multiple quantum well structure. A well layer located relatively close to the cladding layer 21 of the plurality of well layers 23B included in the active layer 23 corresponds to a specific example of a "first well layer" of the present disclosure, and a well layer located relatively close to the cladding layer 26 corresponds to a specific example of a "second well layer" of the present disclosure. A band gap of the barrier layer 23A has a value equal to or larger than a band gap that becomes maximum in each of the well layers 23B.

FIG. 3 illustrates an example of a band gap of the active layer 23. In the plurality of well layers 23B, the well layer 23B (the first well layer) located relatively close to the cladding layer 21 and the well layer 23B (the second well layer) located relatively close to the cladding layer 26 satisfy the following expression. In other words, in the plurality of well layers 23B included in the active layer 23, a band gap inclination angle θ1 of the well layer 23B (the second well layer) located relatively close to the p-type semiconductor layer is smaller than a band gap inclination angle θ2 of the well layer 23B (the first well layer) located relatively close to the n-type semiconductor layer.

$$0 \leq \theta1 < \theta2$$

θ1: a band gap inclination angle in a thickness direction in the well layer 23B (the second well layer)
θ2: a band gap inclination angle in the thickness direction in the well layer 23B (the first well layer)

The band gap inclination angle θ1 is determined, for example, by a difference between a maximum value and a minimum value of a band gap in the well layer 23B (the second well layer) and a film thickness of the well layer 23B (the second well layer). Likewise, the band gap inclination angle θ2 is determined, for example, by a difference between a maximum value and a minimum value of a band gap in the well layer 23B (the first well layer) and a film thickness of the well layer 23B (the first well layer).

In the well layer 23B (the second well layer), the maximum value of the band gap is, for example, a value at a position closest to the cladding layer 26 of the band gap in the well layer 23B (the second well layer), as illustrated in FIG. 3. In the well layer 23B (the second well layer), the minimum value of the band gap is, for example, a value at a position closest to the cladding layer 21 of the band gap in the well layer 23B (the second well layer), as illustrated in FIG. 3. Likewise, in the well layer 23B (the first well layer), the maximum value of the band gap is, for example, a value at a position closest to the cladding layer 26 of the band gap in the well layer 23B (the first well layer), as illustrated in FIG. 3. In the well layer 23B (the first well layer), the minimum value of the band gap is, for example, a value at a position closest to the cladding layer 21 of the band gap in the well layer 23B (the first well layer), as illustrated in FIG. 3.

Both the band gap in the well layer 23B (the first well layer) and the band gap in the well layer 23B (the second well layer) are relatively large on a side on which the cladding layer 26 is located, and are relatively small on a side on which the cladding layer 21 is located. For example, both the band gap in the well layer 23B (the first well layer) and the band gap in the well layer 23B (the second well layer) are continuously increased toward the side on which the cladding layer 26 is located, as illustrated in FIG. 3. In the respective well layers 23B, average values of the band gaps are preferably equal to one another. In such a case, wavelengths of photons generated from the respective well layers 23B are mutually uniform.

FIG. 4 illustrates an example of a valence band and a conduction band of the active layer 23 in FIG. 3. In FIG. 4, a mountain provided to the valence band schematically illustrates a hole wave function. In FIG. 4, a mountain provided to the conduction band schematically illustrates an electron wave function. For example, a band inclination angle in the thickness direction of a valence band or a conduction band in the well layer 23B (the second well layer) is smaller than a band inclination angle in the thickness direction of a valence band or a conduction band in the well layer 23B (the first well layer), as illustrated in FIG. 4. Herein, for example, both energy of the valence band in the well layer 23B (the first well layer) and energy of the valence band in the well layer 23B (the second well layer) are continuously increased toward the side on which the cladding layer 21 is located, as illustrated in FIG. 4. For example, both energy of the conduction band in the well layer 23B (the first well layer) and energy of the conduction band in the well layer 23B (the second well layer) are continuously increased toward the side on which the cladding layer 21 is located, as illustrated in FIG. 4.

Each of the well layers 23B includes a Group III-V nitride semiconductor including at least one element of Ga, Al, In, and B, and an N element. Each of the well layers 23B includes, for example, a semiconductor layer having n-type conductivity (an n-type semiconductor layer). In each of the well layers 23B, for example, Si is used as a dopant to obtain n-type conductivity. A film thickness of each of the well layers 23B is, for example, from 1 nm to 100 nm. It is to be noted that each of the well layers 23B may include a non-doped semiconductor layer. A wavelength of a photon generated by each of the well layers 23B is, for example, from 480 nm to 550 nm.

The well layer 23B (the first well layer) and the well layer 23B (the second well layer) include $Al_xIn_yGa_{1-x-y}N$ (x>0 and y>0). In the well layer 23B (the first well layer) and the well layer 23B (the second well layer), at least one of a composition ratio x of an Al element and a composition ratio y of an In element is relatively large on the side on which the cladding layer 21 is located, and is relatively small on the side on which the cladding layer 26 is located. Moreover, in the well layer 23B (the first well layer) and the well layer 23B (the second well layer), at least one of the composition ratio x of the Al element and the composition ratio y of the In element is continuously increased toward the side on which the cladding layer 21 is located.

It is to be noted that it is possible to discriminate characteristics of the active layer 23 by, for example, a strain amount or a composition ratio distribution in the well layer of the semiconductor light-emitting device with use of, for example, a transmission electron microscope (TEM) or a three-dimensional atom probe (3DAP) method.

[Manufacturing Method]

Next, description is given of a method of manufacturing the semiconductor light-emitting device 1 according to the present embodiment.

First, a GaN substrate is prepared as the substrate 10. Next, the cladding layer 21 and the light guide layer 22 are epitaxially grown at, for example, a growth temperature of 1050° C. on a front surface of the substrate 10 by, for example, an MOCVD (Metal Organic Chemical Vapor Deposition) method. Next, the active layer 23 is epitaxially grown at, for example, a growth temperature of 700° C. by the MOCVD method. Next, the light guide layer 24, the carrier block layer 25, the cladding layer 26, and the contact layer 27 are epitaxially grown at, for example, a growth temperature of 1050° C. by the MOCVD method.

It is to be noted that during execution of MOCVD, for example, trimethyl gallium ((CH3)3Ga) is used as a source gas of Ga, for example, trimethyl aluminum ((CH3)3Al) is used as a source gas of Al, and, for example, trimethyl indium ((CH3)3In) is used as a source gas of In. Moreover, ammonia (NH3) is used as a source gas of N. Further, for example, monosilane (SiH4) is used as a source gas of Si, and, for example, bis(cyclopentadienyl)magnesium ((C5H5)2Mg) is used as a source gas of Mg.

Next, a resist layer having an opening in a region where the electrode layer 32 is to be formed is formed on the contact layer 27, and thereafter, the electrode layer 32 is formed by, for example, a vacuum deposition method or a sputtering method. Subsequently, at least a portion of the contact layer 27 and a portion of the cladding layer 26 are removed by etching with use of, for example, an RIE method to form the ridge section 20A. Next, the insulating film 31 is formed, with use of, for example, a vacuum deposition method or a sputtering method, on the side surface of the ridge section 20A and a surface of the cladding layer 26 that are exposed by the foregoing etching. Subsequently, the electrode layer 33 is formed on the back surface of the substrate 10 by, for example, a lift-off method.

Next, the substrate 10 is cut into a bar shape, and a coating film for control of reflectivity is formed on an exposed end surface portion. Moreover, the substrate 10 cut into the bar shape is further cut into a chip shape. Thus, the semiconductor light-emitting device 1 is fabricated.

[Effects]

Next, description is given of effects in the semiconductor light-emitting device 1 according to the present embodiment.

In general, in the semiconductor light-emitting device, photons are generated by recombination of electrons and holes. In the course of radiative recombination, mainly two kinds, that is, spontaneous emission and induced emission occur. In a semiconductor laser device, the induced emission is dominant in a laser oscillation state, but the spontaneous emission is dominant before laser oscillation.

Now, in order to enhance efficiency of the semiconductor laser device, reduction in a threshold current value (hereinafter referred to as "Ith") is demanded. Large light emission intensity is advantageous to reduce the Ith, and an important issue is how to be able to suppress disincentive factors in the course of radiative recombination. In particular, in a nitride semiconductor laser device, there is an issue that a band in a well layer has an inclination by piezoelectric polarization. FIG. 5 illustrates an example of a band gap of an active layer 123 of a nitride semiconductor laser device according to a comparative example. FIG. 6 illustrates an example of a valence band or a conduction band of the active layer 123 in FIG. 5. The active layer 123 in FIG. 5 is configured by alternately stacking barrier layers 123A and well layers 123B. In general, the band gap in the well layer 123B is constant. In this case, electrons and holes are spatially separated to both ends in the well layers 123B by a band inclination to decrease speed of the spontaneous emission. As a result, the Ith is increased, and efficiency of the semiconductor laser device is decreased.

FIG. 7 illustrates another example of the band gap of the active layer 123 of the nitride semiconductor laser device according to the comparative example. FIG. 8 illustrates an example of a valence band or a conduction band of the active layer 123 in FIG. 7. In the nitride semiconductor laser device illustrated in FIGS. 7 and 8, the band gap of the well layer 123B is continuously decreased toward a side on which an n-type cladding layer is located. At this occasion, an inclination of the conduction band caused by a change in the band gap and an inclination of the valence band caused by piezoelectric polarization are opposed to each other; therefore, electrons and holes are present at a same end in the well layer 123B, which increases the speed of the spontaneous emission. As a result, in the semiconductor laser device, the Ith is decreased, and efficiency of the semiconductor laser device is improved. Moreover, the larger the inclination of the band gap in the well layer 123B is, the more strongly electrons and holes are concentrated on one end in the well layer 123B and the more the speed of the spontaneous emission is increased. Hence, an effect of an improvement in efficiency of the semiconductor laser device is large.

Now, in a semiconductor light-emitting device in which the active layer includes a plurality of well layers, not only coincidence of spatial positions of electrons and holes in a single well layer but also smooth transport of carriers between the well layers is important. If a well layer into which carriers are not sufficiently injected exists, the well layer serves as a strong absorber with respect to a light emission wavelength, thereby significantly impairing efficiency of the semiconductor light-emitting device. In particular, in the nitride semiconductor, mobility of holes is small; therefore, smooth transport of holes to a well layer on a side on which the n-type semiconductor is located is difficult, which causes the foregoing issue pronouncedly.

In a configuration of a semiconductor light-emitting device according to related art (PTL 1), in order to sufficiently reduce spatial separation of electrons and holes in a well layer, it is necessary to make a inclination of a band gap in the well layer steeper. In such a case, for example, energy barrier that is to be surmounted for movement of holes from a well layer on a side on which a p-type semiconductor is located to the well layer 123B on a side on which an n-type semiconductor is located becomes larger to impair smooth transport of holes. Accordingly, an improvement in characteristics as the semiconductor light-emitting device is not sufficiently achieved.

In contrast, in the present embodiment, in the plurality of well layers 23B included in the active layer 23, the band gap inclination angle θ1 of the well layer 23B (the second well layer) located relatively close to the p-type semiconductor layer is smaller than the band gap inclination angle θ2 of the well layer 23B (the first well layer) located relatively close to the n-type semiconductor layer. Accordingly, in the semiconductor light-emitting device 1, energy barrier of the well layer 23B located close to the p-type semiconductor layer is shallower than energy barrier of the well layer located close to the p-type semiconductor layer in a case where a mutually equal band gap inclination angle is provided to all the well layers. As a result, in the active layer 23 including the plurality of well layers 23B, it is possible to improve transport of electrons or holes between the well layers 23B while reducing spatial separation of electrons and holes. Accordingly, in the present embodiment, it is possible to improve light emission intensity. Moreover, in the present embodiment, the Ith is decreased, and the semiconductor light-emitting device having high efficiency is obtained.

Moreover, in the present embodiment, both the band gap in the well layer 23B (the first well layer) and the band gap in the well layer 23B (the second well layer) are relatively large on the side on which the cladding layer 26 is located, and are relatively small on the side on which the cladding layer 21 is located. Further, in the present embodiment, for example, both the band gap in the well layer 23B (the first well layer) and the band gap in the well layer 23B (the second well layer) are continuously increased toward the side on which the cladding layer 26 is located. Furthermore, in the present embodiment, the band inclination angle in the thickness direction of the valence band or the conduction band in the well layer 23B (the second well layer) is smaller than the band inclination angle in the thickness direction of the valence band or the conduction band in the well layer 23B (the first well layer). Hence, in the active layer 23 including the plurality of well layers 23B, it is possible to improve transport of electrons or holes between the well layers 23B while reducing spatial separation of electrons and holes. Accordingly, in the present embodiment, it is possible to improve light emission intensity. Moreover, in the present embodiment, the Ith is decreased, and the semiconductor light-emitting device having high efficiency is obtained.

Further, in the present embodiment, in a case where a GaN substrate having a crystal face orientation {2, 0, −2, 1} as the main surface is used as the substrate 10 to serve as a crystal formation substrate of the semiconductor layer 20, the face orientation of the semiconductor layer 20 to be formed on the substrate 10 takes over the crystal face of the substrate 10, thereby also having a face orientation {2, 0, −2, 1}. At this occasion, an internal electric field generated by piezoelectric polarization is reversed with respect to a most typical face orientation {0, 0, 0, 1} face as the nitride semiconductor light-emitting device. Therefore, in a case where the GaN substrate having the crystal face orientation {2, 0, −2, 1} as the main surface is applied to the related art (PTL 1), energy barrier to be surmounted for movement of holes from the well layer 22B to the well layer 22B becomes larger, which also becomes a cause of impairing smooth transport of holes. This applies for not only the face orientation {2, 0, −2, 1} but also all crystal face orientations in which an electric field of piezoelectric polarization is reversed with respect to the face orientation {0, 0, 0, 1}.

However, in the present embodiment, in the plurality of well layers 23B included in the active layer 23, the band gap inclination angle θ1 of the well layer 23B (the second well layer) located relatively close to the p-type semiconductor layer is smaller than the band gap inclination angle θ2 of the well layer 23B (the first well layer) located relatively close to the n-type semiconductor layer. Hence, even in a case where the GaN substrate having the crystal face orientation {2, 0, −2, 1} as the main surface is used as the substrate 10 to serve as the crystal formation substrate of the semiconductor layer 20, it is possible to lower the energy barrier to be surmounted for movement of holes from the well layer 22B to the well layer 22B. As a result, in the active layer 23 including the plurality of well layers 23B, it is possible to improve transport of electrons or holes between the well layers 23B while reducing spatial separation of electrons and holes. Accordingly, in the present embodiment, it is possible to improve light emission intensity. Moreover, in the present embodiment, the Ith is decreased, and the nitride semiconductor light-emitting device having high efficiency is obtained.

Furthermore, in the present embodiment, in a case where a Group III-V nitride semiconductor substrate such as a GaN substrate, an AlN substrate, an $Al_2O_3$ (sapphire) substrate, a SiC substrate, a Si substrate, a ZrO substrate, or the like is used as the substrate 10, each of the well layers 23B includes the Group III-V nitride semiconductor including at least one element of Ga, Al, In, and B, and the N element. At this occasion, the well layer 23B (the first well layer) and the well layer 23B (the second well layer) include $Al_xIn_yGa_{1-x-y}N$ (x>0 and y>0). Moreover, in the well layer 23B (the first well layer) and the well layer 23B (the second well layer), at least one of the composition ratio x of the Al element and the composition ratio y of the In element is relatively large on the side on which the cladding layer 21 is located, and is relatively small on the side on which the cladding layer 26 is located. Furthermore, in the well layer 23B (the first well layer) and the well layer 23B (the second well layer), at least one of the composition ratio x of the Al element and the composition ratio y of the In element is continuously increased toward the side on which the cladding layer 21 is located. Hence, even in the case where the Group III-V nitride semiconductor substrate such as the GaN substrate, the AlN substrate, the $Al_2O_3$ (sapphire) substrate, the SiC substrate, the Si substrate, the ZrO substrate, or the like is used as the substrate 10, it is possible to lower energy barrier to be surmounted for movement of holes from the well layer 22B to the well layer 22B. As a result, in the active layer 23 including the plurality of well layers 23B, it is possible to improve transport of electrons or holes between the well layers 23B while reducing spatial separation of electrons and holes. Accordingly, in the present embodiment, it is possible to improve light emission intensity. Moreover, in the present embodiment, the Ith is decreased, and the nitride semiconductor light-emitting device having high efficiency is obtained.

[Simulation Results]

Next, description is given of results of simulation performed to examine characteristics of the semiconductor light-emitting device 1 according to the present embodiment.

A simulator using the Maxwell's equations, the Poisson's equation, the rate equation, etc. is applicable for a semiconductor laser simulator. In a simulation model used for calculation, a multiple well layer including two well layers that included InGaN was provided, and a thickness of the well layer was 3 nm. Moreover, an In composition ratio of the well layer located close to the n-type semiconductor layer was inclined from 0.33 to 0.20 in a direction away from the substrate. Further, an In composition ratio of the well layer located close to the p-type semiconductor layer was inclined from 0.28 to 0.33 in the direction away from the substrate. A band gap in the well layer was so inclined by such a configuration as to become smaller with an increasing distance from the substrate. Furthermore, a change amount of the In element composition ratio differed between the two wall layers, which caused a inclination of the band gap in the well layer located close to the n-type semiconductor layer to be larger than an inclination of the band gap in the well layer located close to the p-type semiconductor layer. A light emission wavelength of the nitride-based semiconductor laser in which the active layer included two wall layers having such a configuration was around 500 nm. In addition, as with the foregoing embodiment, this active layer was sandwiched between two light guide layers, and further sandwiched between two cladding layers, thereby having a configuration that was able to be driven as a semiconductor laser. In the following, this simulation model is referred to as a "level A".

Moreover, for comparison with the level A, simulation models of a level B, and a level C were prepared. In the level B, the In composition ratio of the well layer located close to the n-type semiconductor layer was inclined from 0.30 to 0.21 in the direction away from the substrate, and the In composition ratio of the well layer located close to the p-type semiconductor layer was inclined from 0.30 to 0.21 in the direction away from the substrate. In other words, the simulation model of the level B, the nitride semiconductor laser disclosed in the foregoing citation list was a model. Further, in the level C, the In composition ratio in the two layers were fixed to 0.265. In other words, in the simulation model of the level C, a most typical existing nitride semiconductor laser was a model. It is to be noted that as a value of the In composition ratio in the level C, a value that made it possible to obtain a substantially equal light emission wavelength was selected for comparison with the level A and the level B.

Calculation results by the simulation under the foregoing conditions are shown. FIG. 9 illustrates simulation results of current-light output characteristics in the semiconductor light-emitting devices of the levels A, B, and C. As can be seen from FIG. 9, the Ith is the lowest in the level A, and the semiconductor light-emitting device having high efficiency is obtained. In the level B, reduction in the Ith is obtained by an effect of reducing separation of electrons and holes through inclining the band gap in the well layer, as compared with the level C. In the level A, in addition to reduction in separation of electrons and holes, smooth transport of holes between the well layers is obtained, thereby obtaining further reduction in the Ith, as compared with the level B.

FIG. 10 illustrates simulation results of hole concentration distributions in the semiconductor light-emitting devices of the levels A and B. An arrow in the drawing indicates a hole transport direction. In the level B, transport of holes between the well layers is impaired, and nonuniformity of a hole concentration between the well layers is pronounced. In contrast, in the level A, deviation of a hole concentration between the well layers is alleviated, which causes smoother transport of holes.

2. Modification Examples of First Embodiment

Various modification examples of a display unit 1 according to the foregoing embodiment is described below. It is to be noted that in the following, components common to the components of the semiconductor light-emitting device 1 according to the foregoing embodiment are denoted by same reference numerals. Moreover, description of components common to the components of the semiconductor light-emitting device 1 according to the foregoing embodiment is omitted as appropriate.

Modification Example 1

In the foregoing embodiment, a case where the active layer 23 includes three or more well layers 23B is exemplified. However, the active layer 23 may include, for example, only two well layers 23B, as illustrated in FIG. 11. Even in this case, in the plurality of well layers 23B included in the active layer 23, the band gap inclination angle θ1 of the well layer 23B (the second well layer) located relatively close to the p-type semiconductor layer is smaller than the band gap inclination angle θ2 of the well layer 23B (the first well layer) located relatively close to the n-type semiconductor layer. As a result, in the active layer 23 including the plurality of well layers 23B, it is possible to improve transport of electrons or holes between the well layers 23B while reducing spatial separation of electrons and holes. Accordingly, it is possible to improve light emission intensity. Moreover, the Ith is decreased, and the semiconductor light-emitting device having high efficiency is obtained.

Modification Example 2

In the embodiment and the modification example 1 mentioned above, a case where each of the well layers 23B has a band gap inclination is exemplified. However, the active layer 23 may include, for example, one or more well layers 23B not having a band gap inclination, as illustrated in FIG. 12.

In the present modification example, the band gap of the well layer 23B (the first well layer) is relatively large on the side on which the cladding layer 26 is located, and is relatively small on the side on which the cladding layer 21 is located. In contrast, the band gap of the well layer 23B (the second well layer) is equal on the side on which the cladding layer 21 is located and the side on which the cladding layer 26 is located. Moreover, in the present modification example, the band gap of the well layer 23B (the first well layer) is continuously increased toward the side on which the cladding layer 26 is located. In contrast, the band gap of the well layer 23B (the second well layer) is even. Further, in the present modification example, for example, the band inclination angle in the thickness direction of the valence band or the conduction band in the well layer 23B (the second well layer) is smaller than the band inclination angle in the thickness direction of the valence band and or the conduction band in the well layer (the first well layer), as illustrated in FIG. 13. Hence, in the active layer 23 including the plurality of well layers 23B, it is possible to improve transport of electrons or holes between the well layers 23B while reducing spatial separation of electrons and holes, as with the foregoing embodiment. Accordingly, it is possible to improve light emission intensity. Moreover, the Ith is decreased, and the semiconductor light-emitting device having high efficiency is obtained.

Moreover, in the present modification example, in a case where the Group III-V nitride semiconductor substrate such as the GaN substrate, the AlN substrate, the Al2O3 (sapphire) substrate, the SiC substrate, the Si substrate, the ZrO substrate, or the like is used as the substrate 10, each of the well layers 23B includes the Group III-V nitride semiconductor including at least one element of Ga, Al, In, and B, and the N element. Further, the well layer 23B (the first well layer) and the well layer 23B (the second well layer) include $Al_xIn_yGa_{1-x-y}N$ (x>0 and y>0). At this occasion, in the well layer 23B (the first well layer), at least one of the composition ratio x of the Al element and the composition ratio y of the In element is relatively large on the side on which the cladding layer 21 is located, and is relatively small on the side on which the cladding layer 26 is located. Furthermore, in the well layer 23B (the second well layer), the composition ratio x of the Al element and the composition ratio y of the In element are constant. Moreover, in the well layer 23B (the first well layer), at least one of the composition ratio x of the Al element and the composition ratio y of the In element is continuously increased toward the side on which the cladding layer 21 is located. Therefore, even in the case where the Group III-V nitride semiconductor substrate such as the GaN substrate, the AlN substrate, the Al2O3 (sapphire) substrate, the SiC substrate, the Si substrate, the ZrO substrate, or the like is used as the substrate 10, it is possible to lower energy barrier to be surmounted for movement of holes from the well layer 22B to the well layer 22B. As a result, in the active layer 23 including the plurality of well layers 23B, it is possible to improve transport of electrons or holes between the well layers 23B while reducing spatial separation of electrons and holes. Accordingly, it is possible to improve light emission intensity. Moreover, the Ith is decreased, and the semiconductor light-emitting device having high efficiency is obtained.

Modification Example 3

In the embodiment, the modification examples 1 and 2 mentioned above, a case where only two well layers 23B have a band gap inclination is exemplified. However, three or more well layers 23B may have a band gap inclination. For example, three well layers 23B may have a band gap inclination, as illustrated in FIG. 14. In this case, in any two well layers 23B of the three or more well layers 23B, the band gap inclination angle θ1 of the well layer 23B (the second well layer) located relatively close to the p-type semiconductor layer is smaller than the band gap inclination angle θ2 of the well layer 23B (the first well layer) located relatively close to the n-type semiconductor layer. As a result, in the active layer 23 including the plurality of well layers 23B, it is possible to improve transport of electrons or holes between the well layers 23B while reducing spatial separation of electrons and holes. Accordingly, it is possible to improve light emission intensity. Moreover, the Ith is decreased, and the semiconductor light-emitting device having high efficiency is obtained.

Modification Example 4

In the embodiment and the modification examples 2 and 3 mentioned above, for example, the well layer 23B having a smaller band gap inclination angle (including zero) than the band gap inclination angles θ1 and θ2 of the well layer 23B (the first well layer) and the well layer 23B (the second well layer) may be provided between the well layer 23B (the first well layer) and the well layer 23B (the second well layer), as illustrated in FIG. 15. Even in such a case, in the active layer 23 including the plurality of well layers 23B, it is possible to improve transport of electrons or holes between the well layers 23B while reducing spatial separation of electrons and holes. Accordingly, it is possible to improve light emission intensity. Moreover, the Ith is decreased, and the semiconductor light-emitting device having high efficiency is obtained.

Modification Example 5

In the embodiment and the modification examples 1, 3, and 4 mentioned above, the band gaps of the well layer 23B (the first well layer) and the well layer 23B (the second well layer) are gradually increased toward the side on which the cladding layer 26 is located. However, the band gaps of the well layer 23B (the first well layer) and the well layer 23B (the second well layer) may be intermittently increased toward the side on which the cladding layer 26 is located. Both the band gaps of the well layer 23B (the first well layer) and the well layer 23B (the second well layer) may be increased, for example, in a stepwise manner, as illustrated in FIG. 16. At this occasion, the number of steps, widths of the steps, and change amounts of the band bap between mutually adjacent steps are freely selectable. Moreover, the widths of the steps and the change amounts of the band gap between mutually adjacent steps may not be equal. Even in such a case, in the active layer 23 including the plurality of well layers 23B, it is possible to improve transport of electrons or holes between the well layers 23B while reducing spatial separation of electrons and holes. Accordingly, it is possible to improve light emission intensity. Moreover, the Ith is decreased, and the semiconductor light-emitting device having high efficiency is obtained.

Modification Example 6

In the embodiment and the modification examples 1, 3, and 4 mentioned above, the band gap in the well layer 23B (the first well layer) and the band gap in the well layer 23B (the second well layer) are linearly increased toward the side on which the cladding layer 26 is located. However, both the band gap in the well layer 23B (the first well layer) and the band gap in the well layer 23B (the second well layer) may be nonlinearly increased toward the side on which the cladding layer 26 is located. Both the band gap in the well layer 23B (the first well layer) and the band gap in the well layer 23B (the second well layer) may have, for example, a protruded shape that is protruded toward a bottom side, as illustrated in FIG. 17. Moreover, both the band gap in the well layer 23B (the first well layer) and the band gap in the well layer 23B (the second well layer) may have a depressed shape having a depression on the bottom side. Even in such a case, in the active layer 23 including the plurality of well layers 23B, it is possible to improve transport of electrons or holes between the well layers 23B while reducing spatial separation of electrons and holes. Accordingly, it is possible to improve light emission intensity. Moreover, the Ith is decreased, and the semiconductor light-emitting device having high efficiency is obtained.

Modification Example 7

In the embodiment and the modification examples 1, 3, and 4 mentioned above, the band gap in the well layer 23B (the first well layer) and the band gap in the well layer 23B (the second well layer) are linearly increased toward the side on which the cladding layer 26 is located. However, in the well layer 23B (the first well layer) and the well layer 23B (the second well layer), for example, a band gap having a protruded shape that is protruded toward the bottom side or a band gap having a depressed shape having a depression on the bottom side may be provided in the middle of the band gap that are linearly increased toward the side on which the cladding layer 26 is located, as illustrated in FIG. 18. Even in such a case, in the active layer 23 including the plurality of well layers 23B, it is possible to improve transport of electrons or holes between the well layers 23B while reducing spatial separation of electrons and holes. Accordingly, it is possible to improve light emission intensity. Moreover, the Ith is decreased, and the semiconductor light-emitting device having high efficiency is obtained.

Modification Example 8

In the embodiment and the modification examples 1 to 7 mentioned above, the maximum value of the band gap in the well layer 23B (the second well layer) is a value at a position closest to the cladding layer 26 of the band gap in the well layer 23B (the second well layer). Moreover, in the embodiment and the modification examples 1 to 7 mentioned above, the minimum value of the band gap in the well layer 23B (the second well layer) is a value at a position closest to the cladding layer 21 of the band gap in the well layer 23B (the second well layer). Further, in the embodiment and the modification examples 1 to 7 mentioned above, the maximum value of the band gap in the well layer 23B (the first well layer) is a value at a position closest to the cladding layer 26 of the band gap in the well layer 23B (the first well layer). Furthermore, in the embodiment and the modification examples 1 to 7 mentioned above, the minimum value of the band gap in the well layer 23B (the first well layer) is a value at a position closest to the cladding layer 21 of the band gap in the well layer 23B (the first well layer).

However, in the embodiment and the modification examples 1 to 7 mentioned above, the maximum value of the band gap in the well layer 23B (the second well layer) may be a value at the position closest to the cladding layer 21 of the band gap in the well layer 23B (the second well layer). Moreover, in the embodiment and the modification examples 1 to 7 mentioned above, the minimum value of the band gap in the well layer 23B (the second well layer) may be a value at the position closest to the cladding layer 26 of the band gap in the well layer 23B (the second well layer). Further, in the embodiment and the modification examples 1 to 7 mentioned above, the maximum value of the band gap in the well layer 23B (the first well layer) may be a value at the position closest to the cladding layer 21 of the band gap in the well layer 23B (the first well layer). Furthermore, in the embodiment and the modification examples 1 to 7 mentioned above, the minimum value of the band gap in the well layer 23B (the first well layer) may be a value at the position closest to the cladding layer 26 of the band gap in the well layer 23B (the first well layer).

In the present modification example, both the band gap in the well layer 23B (the first well layer) and the band gap in the well layer 23B (the second well layer) are relatively small on the side on which cladding layer 26 is located, and are relatively large on the side on which the cladding layer 21 is located. In the present modification example, for example, both the band gap in the well layer 23B (the first well layer) and the band gap in the well layer 23B (the second well layer) are continuously or intermittently decreased toward the side on which the cladding layer 26 is located, as illustrated in FIGS. 19, 20, and 21. It is to be noted that FIG. 19 illustrates a modification example of the band gap in the well layer 23 illustrated in FIGS. 3, 11, 12, 14, and 15. FIG. 20 illustrates a modification example of the band gap in the well layer 23 illustrated in FIG. 16. FIG. 21 illustrates a modification example of the band gap in the well layer 23 illustrated in FIG. 17. Average values of the band gaps in the respective well layers 23B are preferably equal to one another. This allows wavelengths of photons generated by the respective well layers 23B to be mutually uniform.

Even in the present modification example, the band inclination angle in the thickness direction of the valence band or the conduction band in the well layer 23B (the second well layer) is smaller than the band inclination angle in the thickness direction of the valence band or the conduction band in the well layer 23B (the first well layer).

Moreover, in the present modification example, in the well layer 23B (the first well layer) and the well layer 23B (the second well layer), at least one of the composition ratio x of the Al element and the composition ratio y of the In element is relatively small on the side on which the cladding layer 21 is located, and is relatively large on the side on which the cladding layer 26 is located. Further, in the well layer 23B (the first well layer) and the well layer 23B (the second well layer), at least one of the composition ratio x of the Al element and the composition ratio y of the In element is continuously decreased toward the side on which the cladding layer 21 is located.

Furthermore, in the well layer 23B (the first well layer) and the well layer 23B (the second well layer), for example, a band gap having a protruded shape that is protruded toward the bottom side or a band gap having a depressed shape having a depression on the bottom side may be provided in the middle of the band gap that are linearly increased toward the side on which the cladding layer 21 is located, as illustrated in FIG. 22. FIG. 22 illustrates a modification example of the band gap in the well layer 23.

Even in the present modification example, as with the foregoing embodiment, in the active layer 23 including the plurality of well layers 23B, it is possible to improve transport of electrons or holes between the well layers 23B while reducing spatial separation of electrons and holes. Accordingly, it is possible to improve light emission intensity. Moreover, the Ith is decreased, and the semiconductor light-emitting device having high efficiency is obtained.

3. Second Embodiment

Next, description is given of a display unit 2 according to a second embodiment of the present disclosure. FIG. 23 illustrates a schematic configuration example of the display unit 2 according to the present embodiment. The display unit 2 includes, for example, a pixel array section 40, a controller 50, and a driver 60. The controller 50 and the driver 60 correspond to specific examples of a "drive circuit" of the present technology. The pixel array section 40 includes a plurality of display pixels 41 arranged in a matrix. The controller 50 and the driver 60 drive the respective display pixels 41 on the basis of an image signal Din and a synchronization signal Tin inputted from outside.

The controller 50 and the driver 60 drives the respective display pixels 41 by active matrix driving, which causes the pixel array section 40 to display an image on the basis of the image signal Din and the synchronization signal Tin inputted from outside. The pixel array section 40 includes a plurality of scanning lines extending in a row direction, a plurality of signal lines extending in a column direction, and the plurality of display pixels 41 one of which is provided to each of intersections of the scanning lines and the signal lines.

The scanning lines are used for selection of the respective display pixels 41, and supply selection pulses that select the respective display pixels 41 on a predetermined unit basis (for example, a pixel row basis). The signal lines are used to supply a signal voltage corresponding to the image signal Din to the respective display pixels 41, and supply data pulses including the signal voltage to the respective display pixels 41.

Each of the display pixels 41 includes a plurality of sub-pixels each including a semiconductor light-emitting device. In each of the display pixels 41, the semiconductor light-emitting device included in at least one of the plurality of sub-pixels is the semiconductor light-emitting device 1 according to the foregoing embodiment or the modification examples thereof.

The driver 60 includes, for example, a horizontal selector 61 and a write scanner 62. The horizontal selector 61 applies, to the respective signal lines, for example, an analog signal voltage inputted from the image signal processing circuit 51 in accordance with (in synchronization with) input of a control signal from the controller 50. The write scanner 62 scans the plurality of display pixels 41 on a predetermined unit basis. Specifically, the write scanner 62 sequentially outputs a selection pulse to the respective scanning lines in one frame period. The write scanner 62 selects the plurality of scanning lines in a predetermined sequence in accordance with (in synchronization with) input of a control signal from the controller 50 to execute writing of the signal voltage in a desired order.

The controller 50 includes, for example, an image signal processing circuit 51, a timing generation circuit 52, and a power source circuit 53. The image signal processing circuit 51 performs, for example, predetermined correction on the digital image signal Din inputted from outside, and generates a signal voltage on the basis of a thus-obtained image signal. The image signal processing circuit 51 outputs, for example, the generated signal voltage to the horizontal selector 61. The timing generation circuit 52 performs control to cause respective circuits in the driver 60 to operate in conjunction with one another. The timing generation circuit 62 outputs, for example, a control signal to each of the circuits in the driver 60 in accordance with (in synchronization with) the synchronization signal Tin inputted from outside. The power source circuit 63 generates and supplies various fixed voltages necessary for various circuits such as the horizontal selector 61, the write scanner 62, the power source scanner 63, the image signal processing circuit 51, and the timing generation circuit 52.

In the present embodiment, in each of the display pixels 41, the semiconductor light-emitting device 1 according to the foregoing embodiment or the modification examples thereof is used. This makes it possible to achieve low power consumption and high light emission intensity.

4. Third Embodiment

Next, description is given of an electronic apparatus 3 according to a third embodiment of the present disclosure. FIG. 24 illustrates a schematic configuration example of the electronic apparatus 3 according to the present embodiment. The electronic apparatus 3 is, for example, a mobile terminal having a display surface on a main surface of a plate-like housing. The electronic apparatus 3 includes, for example, the display unit 2 according to the foregoing second embodiment at a position of the display surface. The pixel array section 40 of the display unit 2 is disposed on the display surface of the electronic apparatus 3.

In the present embodiment, in the respective display pixels 41, the semiconductor light-emitting device 1 according to the foregoing embodiment or the modification examples thereof is used. This makes it possible to achieve low power consumption and high light emission intensity.

It is to be noted that the display unit 2 according to the foregoing second embodiment is applicable to a display unit of any of electronic apparatuses in every field that display externally inputted image signals or internally generated image signals as images or video pictures. The electronic apparatuses include a television, a digital camera, a notebook personal computer, a mobile terminal apparatus such as a mobile phone, a video camera, etc.

Although the present disclosure has been described with reference to a plurality of embodiments and a plurality of modification examples, the present disclosure is not limited to the foregoing embodiments, etc., and may be modified in a variety of ways. It is to be noted that effects described in the description are merely examples. Effects of the present disclosure are not limited to the effects described in the description. The present disclosure may include effects other than the effects described in the description.

For example, in the foregoing embodiments, etc., the semiconductor layer 20 includes the ridge section 20A. Alternatively, the semiconductor layer 20 may include a flat top surface on which the ridge section 20A is not provided, or may have a depressed shape on the top surface. Moreover, for example, in the foregoing embodiments, etc., the substrate 10 and the semiconductor layer 20 include the Group III-V nitride semiconductor. Alternatively, the substrate 10 and the semiconductor layer 20 may include a semiconductor material different from the Group III-V nitride semiconductor.

Moreover, for example, the present disclosure may have the following configurations.

(1)
A semiconductor light-emitting device, including:
an n-type semiconductor layer;
a p-type semiconductor layer; and
an active layer provided between the n-type semiconductor layer and the p-type semiconductor layer and including a plurality of well layers, in which
in the plurality of well layers, a first well layer located relatively close to the n-type semiconductor layer and a second well layer located relatively close to the p-type semiconductor layer satisfy the following expression, $$0 \leq \theta_1 < \theta_2$$

where θ1 is a band gap inclination angle in a thickness direction in the second well layer, and
θ2 is a band gap inclination angle in the thickness direction in the first well layer.

(2)
The semiconductor light-emitting device according to (1), in which both a band gap in the first well layer and a band gap in the second well layer are continuously or intermittently decreased toward a side on which the n-type semiconductor layer is located.

(3)
The semiconductor light-emitting device according to (2), in which a band inclination angle in the thickness direction of a valence band or a conduction band in the second well layer is smaller than a band inclination angle in the thickness direction of a valence band or a conduction band in the first well layer.

(4)
The semiconductor light-emitting device according to (1), in which each of the well layers includes a Group III-V nitride semiconductor including at least one element of Ga, Al, In, and B, and an N element.

(5)
The semiconductor light-emitting device according to any one of (1) to (4), in which
the first well layer and the second well layer include $Al_xIn_yGa_{1-x-y}N$ (x>0 and y0), and
in the first well layer and the second well layer, at least one of a composition ratio x of an Al element and a composition ratio y of an In element is relatively large on a side on which the n-type semiconductor layer is located, and is relatively small on a side on which the p-type semiconductor layer is located.

(6)
The semiconductor light-emitting device according to (5), in which in the first well layer and the second well layer, at least one of the composition ratio x of the Al element and the composition ratio y of the In element is continuously or intermittently increased toward the side on which the n-type semiconductor layer is located.

(7)
The semiconductor light-emitting device according to (1), in which both a band gap in the first well layer and a band gap in the second well layer are continuously or intermittently increased toward a side on which the n-type semiconductor layer is located.

(8)
The semiconductor light-emitting device according to (7), in which a band inclination angle in the thickness direction of a valence band or a conduction band in the second well layer is smaller than a band inclination angle in the thickness direction of a valence band or a conduction band in the first well layer.

(9)
The semiconductor light-emitting device according to any one of (4), (7), and (8), in which
the first well layer and the second well layer include $Al_xIn_yGa_{1-x-y}N$ (x>0 and y>0), and
in the first well layer and the second well layer, at least one of a composition ratio x of an Al element and a composition ratio y of an In element is relatively small on a side on which the n-type semiconductor layer is located, and is relatively large on a side on which the p-type semiconductor layer is located.

(10)
The semiconductor light-emitting device according to (9), in which in the first well layer and the second well layer, at least one of the composition ratio x of the Al element and the composition ratio y of the In element is continuously or intermittently decreased toward the side on which the n-type semiconductor layer is located.

(11)
The semiconductor light-emitting device according to (1), in which
a band gap in the first well layer is continuously or intermittently decreased toward a side on which the n-type semiconductor layer is located, and
a band gap in the second well layer is even.

(12)
The semiconductor light-emitting device according to (4) or (11), in which
the first well layer and the second well layer include $Al_xIn_yGa_{1-x-y}N$ (x>0 and y>0),
in the first well layer, at least one of a composition ratio x of an Al element and a composition ratio y of an In element is relatively large on a side on which the n-type semiconductor layer is located, and is relatively small on a side on which the p-type semiconductor layer is located, and
in the second well layer, the composition ratio x of the Al element and the composition ratio y of the In element are constant.

(13)
The semiconductor light-emitting device according to (12), in which in the first well layer, at least one of the composition ratio x of the Al element and the composition ratio y of the In element is continuously or intermittently increased toward the side on which the n-type semiconductor layer is located.

(14)

The semiconductor light-emitting device according to (1), in which a band gap in the first well layer is continuously or intermittently increased toward a side on which the n-type semiconductor layer is located, and a band gap in the second well layer is even.

(15)

The semiconductor light-emitting device according to (4) or (14), in which the first well layer and the second well layer include $Al_xIn_yGa_{1-x-y}N$ (x≥0 and y>0), in the first well layer, at least one of a composition ratio x of an Al element and a composition ratio y of an In element is relatively small on a side on which the n-type semiconductor layer is located, and is relatively large on a side on which the p-type semiconductor layer is located, and in the second well layer, the composition ratio x of the Al element and the composition ratio y of the In element are constant.

(16)

The semiconductor light-emitting device according to (15), in which in the first well layer, at least one of the composition ratio x of the Al element and the composition ratio y of the In element is continuously or intermittently decreased toward the side on which the n-type semiconductor layer is located.

(17)

A display unit, including:

a pixel array section including a plurality of display pixels arranged in a matrix; and a drive circuit that drives the respective display pixels;

in which each of the display pixels includes a plurality of sub-pixels each including a semiconductor light-emitting device, the semiconductor light-emitting device included in at least one of the plurality of the sub-pixels in each of the display pixels includes:

an n-type semiconductor layer, a p-type semiconductor layer, and an active layer provided between the n-type semiconductor layer and the p-type semiconductor layer and including a plurality of well layers, and in the plurality of the well layers, a first well layer located relatively close to the n-type semiconductor layer and a second well layer located relatively close to the p-type semiconductor layer satisfy the following expression, $0 \leq \theta 1 < \theta 2$ where θ1 is a band gap inclination angle in a thickness direction in the second well layer, and θ2 is a band gap inclination angle in the thickness direction in the first well layer.

(18)

An electronic apparatus provided with a display unit, the display unit including:

a pixel array section including a plurality of display pixels arranged in a matrix; and a drive circuit that drives the respective display pixels;

in which each of the display pixels includes a plurality of sub-pixels each including a semiconductor light-emitting device, the semiconductor light-emitting device included at least one of the plurality of sub-pixels in each of the display pixels includes:

an n-type semiconductor layer, a p-type semiconductor layer, and an active layer provided between the n-type semiconductor layer and the p-type semiconductor layer and including a plurality of well layers, and in the plurality of the well layers, a first well layer located relatively close to the n-type semiconductor layer and a second well layer located relatively close to the p-type semiconductor layer satisfy the following expression, $0 \leq \theta 1 < \theta 2$ where θ1 is a band gap inclination angle in a thickness direction in the second well layer, and θ2 is a band gap inclination angle in the thickness direction in the first well layer.

This application claims the benefit of Japanese Priority Patent Application JP2016-002781 filed on Jan. 8, 2016, the entire contents of which are incorporated herein by reference.

It should be understood by those skilled in the art that various modifications, combinations, sub-combinations and alterations may occur depending on design requirements and other factors insofar as they are within the scope of the appended claims or the equivalents thereof.

The invention claimed is:

1. A semiconductor light-emitting device, comprising:
an n-type semiconductor layer;
a p-type semiconductor layer; and
an active layer between the n-type semiconductor layer and the p-type semiconductor layer, wherein
the active layer includes a plurality of well layers,
a first well layer of the plurality of well layers is closer to the n-type semiconductor layer than a second well layer of the plurality of well layers,
the second well layer is closer to the p-type semiconductor layer than the first well layer,
the first well layer and the second well layer satisfy a following expression, $1 \leq \theta 1 < \theta 2$ where θ1 is a first band gap inclination angle in a thickness direction in the second well layer and θ2 is a second band gap inclination angle in the thickness direction in the first well layer, and
each of a band gap in the first well layer and a band gap in the second well layer decreases one of continuously or intermittently toward a side of the n-type semiconductor layer.

2. The semiconductor light-emitting device according to claim 1, wherein a first band inclination angle in the thickness direction of one of a valence band or a conduction band in the second well layer is smaller than a second band inclination angle in the thickness direction of one of a valence band or a conduction band in the first well layer.

3. The semiconductor light-emitting device according to claim 1, wherein each of the plurality of well layers includes a Group III-V nitride semiconductor including at least one element of Ga, Al, In, or B, and an N element.

4. The semiconductor light-emitting device according to claim 3, wherein the first well layer and the second well layer include $Al_xIn_yGa_{1-x-y}N$ (x>0 and y≥0), and in the first well layer and the second well layer, at least one of a composition ratio x of an Al element or a composition ratio y of an In element is larger on the side of the n-type semiconductor layer than on a side of the p-type semiconductor layer.

5. The semiconductor light-emitting device according to claim 4, wherein in the first well layer and the second well layer, the at least one of the composition ratio x of the Al element or the composition ratio y of the In element increases one of continuously or intermittently toward the side of the n-type semiconductor layer.

6. The semiconductor light-emitting device according to claim 3, wherein
the first well layer and the second well layer include Al$_x$In$_y$Ga$_{1-x-y}$N (x>0 and y>0), and
in the first well layer and the second well layer, at least one of a composition ratio x of an Al element or a composition ratio y of an In element is smaller on the side of the n-type semiconductor layer than on a side of the p-type semiconductor layer.

7. The semiconductor light-emitting device according to claim 6, wherein in the first well layer and the second well layer, the at least one of the composition ratio x of the Al element or the composition ratio y of the In element decreases one of continuously or intermittently toward the side of the n-type semiconductor layer.

8. The semiconductor light-emitting device according to claim 3, wherein
the first well layer and the second well layer include Al$_x$In$_y$Ga$_{1-x-y}$N (x>0 and y>0),
in the first well layer, at least one of a composition ratio x of an Al element or a composition ratio y of an In element is larger on the side of the n-type semiconductor layer than on a side of the p-type semiconductor layer, and
in the second well layer, the composition ratio x of the Al element and the composition ratio y of the In element are constant.

9. The semiconductor light-emitting device according to claim 8, wherein in the first well layer, the at least one of the composition ratio x of the Al element or the composition ratio y of the In element increases one of continuously or intermittently toward the side of the n-type semiconductor layer.

10. The semiconductor light-emitting device according to claim 3, wherein
the first well layer and the second well layer include Al$_x$In$_y$Ga$_{1-x-y}$N (x>0 and y>0),
in the first well layer, at least one of a composition ratio x of an Al element or a composition ratio y of an In element is smaller on the side of the n-type semiconductor layer than on a side of the p-type semiconductor layer is located, and
in the second well layer, the composition ratio x of the Al element and the composition ratio y of the In element are constant.

11. The semiconductor light-emitting device according to claim 10, wherein in the first well layer, the at least one of the composition ratio x of the Al element or the composition ratio y of the In element decreases one of continuously or intermittently toward the side of the n-type semiconductor layer.

12. A display unit, comprising:
a pixel array section including a plurality of display pixels in a matrix; and
a drive circuit configured to drive the plurality of display pixels, wherein
each of the plurality of display pixels includes a plurality of sub-pixels,
each of the plurality of sub-pixels includes a semiconductor light-emitting device, and
the semiconductor light-emitting device includes:
an n-type semiconductor layer,
a p-type semiconductor layer, and
an active layer between the n-type semiconductor layer and the p-type semiconductor layer, wherein
the active layer includes a plurality of well layers,
a first well layer of the plurality of well layers is closer to the n-type semiconductor layer than a second well layer of the plurality of well layers,
the second well layer is closer to the p-type semiconductor layer than the first well layer,
the first well layer and the second well layer satisfy a following expression, $1 \leq \theta1 < \theta2$ where θ1 is a first band gap inclination angle in a thickness direction in the second well layer and θ2 is a second band gap inclination angle in the thickness direction in the first well layer, and
each of a band gap in the first well layer and a band gap in the second well layer decreases one of continuously or intermittently toward a side of the n-type semiconductor layer.

13. An electronic apparatus, comprising:
a display unit that includes:
a pixel array section including a plurality of display pixels in a matrix; and
a drive circuit configured to drive the plurality of display pixels, wherein
each of the plurality of display pixels includes a plurality of sub-pixels,
each of the plurality of sub-pixels includes a semiconductor light-emitting device, and
the semiconductor light-emitting device includes:
an n-type semiconductor layer,
a p-type semiconductor layer, and
an active layer between the n-type semiconductor layer and the p-type semiconductor layer, wherein
the active layer includes a plurality of well layers,
a first well layer of the plurality of well layers is closer to the n-type semiconductor layer than a second well layer of the plurality of well layers,
the second well layer is closer to the p-type semiconductor layer than the first well layer,
the first well layer and the second well layer satisfy a following expression, $1 \leq \theta1 < \theta2$ where θ1 is a first band gap inclination angle in a thickness direction in the second well layer and θ2 is a second band gap inclination angle in the thickness direction in the first well layer, and
each of a band gap in the first well layer and a band gap in the second well layer decreases one of continuously or intermittently toward a side of the n-type semiconductor layer.

14. A semiconductor light-emitting device, comprising:
an n-type semiconductor layer;
a p-type semiconductor layer; and
an active layer between the n-type semiconductor layer and the p-type semiconductor layer, wherein
the active layer includes a plurality of well layers,
a first well layer of the plurality of well layers is closer to the n-type semiconductor layer than a second well layer of the plurality of well layers,
the second well layer is closer to the p-type semiconductor layer than the first well layer, the first well layer and the second well layer satisfy a following expression, $$1 \leq \theta 1 < \theta 2$$

where θ1 is a first band gap inclination angle in a thickness direction in the second well layer and θ2 is a second band gap inclination angle in the thickness direction in the first well layer,
a band gap in the first well layer decreases one of continuously or intermittently toward a side of the n-type semiconductor layer, and
a band gap in the second well layer is even.

15. A semiconductor light-emitting device, comprising:
an n-type semiconductor layer;
a p-type semiconductor layer; and
an active layer between the n-type semiconductor layer and the p-type semiconductor layer, wherein the active layer includes a plurality of well layers,
a first well layer of the plurality of well layers is closer to the n-type semiconductor layer than a second well layer of the plurality of well layers,
the second well layer is closer to the p-type semiconductor layer than the first well layer,
the first well layer and the second well layer satisfy a following expression, $$0 \leq \theta 1 < \theta 2$$

where θ1 is a first band gap inclination angle in a thickness direction in the second well layer and θ2 is a second band gap inclination angle in the thickness direction in the first well layer,
a band gap in the first well layer increases one of continuously or intermittently toward a side of the n-type semiconductor layer, and
a band gap in the second well layer is even.

* * * * *